(12) United States Patent
Zhang et al.

(10) Patent No.: US 12,513,980 B2
(45) Date of Patent: Dec. 30, 2025

(54) STACKED VERTICAL TRANSPORT FIELD EFFECT TRANSISTOR WITH ANCHORS

(71) Applicant: International Business Machines Corporation, Armonk, NY (US)

(72) Inventors: Chen Zhang, Albany, NY (US); Kangguo Cheng, Schenectady, NY (US); Tenko Yamashita, Schenectady, NY (US); Wenyu Xu, Albany, NY (US); Fee Li Lie, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 620 days.

(21) Appl. No.: 18/068,155

(22) Filed: Dec. 19, 2022

(65) Prior Publication Data
US 2023/0122234 A1    Apr. 20, 2023

Related U.S. Application Data

(62) Division of application No. 16/382,897, filed on Apr. 12, 2019, now Pat. No. 11,569,229.

(51) Int. Cl.
| | |
|---|---|
| *H10D 84/83* | (2025.01) |
| *H10D 30/01* | (2025.01) |
| *H10D 30/62* | (2025.01) |
| *H10D 30/63* | (2025.01) |
| *H10D 30/67* | (2025.01) |
| *H10D 88/00* | (2025.01) |

(52) U.S. Cl.
CPC ......... *H10D 84/834* (2025.01); *H10D 30/024* (2025.01); *H10D 30/025* (2025.01); *H10D 30/62* (2025.01); *H10D 30/63* (2025.01); *H10D 30/6735* (2025.01); *H10D 88/00* (2025.01)

(58) Field of Classification Search
CPC ...................................... H10D 84/83
See application file for complete search history.

(56) References Cited

U.S. PATENT DOCUMENTS

| | | |
|---|---|---|
| 6,770,534 B2 | 8/2004 | Cho et al. |
| 7,078,298 B2 | 7/2006 | Lee et al. |
| 7,683,428 B2 | 3/2010 | Chidambarrao et al. |
| 9,202,894 B1 | 12/2015 | Zang |
| 9,614,087 B1 | 4/2017 | Cheng et al. |
| 9,755,073 B1 | 9/2017 | Cheng et al. |
| 9,799,765 B1 | 10/2017 | Bergendahl et al. |
| 9,837,408 B1 | 12/2017 | Bi et al. |
| 2006/0261406 A1 | 11/2006 | Chen |

(Continued)

OTHER PUBLICATIONS

U.S. Appl. No. 15/879,181, filed Jan. 24, 2018.
(Continued)

*Primary Examiner* — Marvin Payen
(74) *Attorney, Agent, or Firm* — Amin, Turocy & Watson, LLP

(57) ABSTRACT

Techniques regarding anchors for fins comprised within stacked VTFET devices are provided. For example, one or more embodiments described herein can comprise an apparatus, which can further comprise a fin extending from a semiconductor body. The fin can be comprised within a stacked vertical transport field effect transistor device. The apparatus can also comprise a dielectric anchor extending from the semiconductor body and adjacent to the fin. Further, the dielectric anchor can be coupled to the fin.

20 Claims, 12 Drawing Sheets

(56) References Cited

U.S. PATENT DOCUMENTS

| | | |
|---|---|---|
| 2016/0043074 A1 | 2/2016 | Hurley et al. |
| 2018/0005834 A1 | 1/2018 | Cheng et al. |
| 2019/0051735 A1 | 2/2019 | Qi et al. |

OTHER PUBLICATIONS

Non-Final Office Action received for U.S. Appl. No. 16/382,897 dated Dec. 9, 2021, 13 pages.
List of IBM Patents or Applications Treated as Related.
Final Office Action for U.S. Appl. No. 16/382,897 dated Jun. 27, 2022, 6 pages.

| ETCHING A SEMICONDUCTOR BODY TO FORM A FIN AND A DIELECTRIC ANCHOR, WHEREIN THE DIELECTRIC ANCHOR IS ADJACENT AND COUPLED TO THE FIN, AND WHEREIN THE DIELECTRIC ANCHOR PROVIDES POSTURAL SUPPORT TO THE FIN | ← 1102 |

↓

| FORMING A STACKED VTFET DEVICE ON THE SEMICONDUCTOR BODY, WHEREIN THE FIN IS COMPRISED WITHIN THE STACKED VTFET DEVICE | ← 1104 |

STACKED VERTICAL TRANSPORT FIELD EFFECT TRANSISTOR WITH ANCHORS

BACKGROUND

The subject disclosure relates to stacked vertical transport field effect transistors ("VTFET"), and more specifically, to one or more stacked VTFET structures comprising one or more anchors that can provide postural support.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods regarding VTFET devices with enhanced postural support are described.

According to an embodiment, an apparatus is provided. The apparatus can comprise a fin extending from a semiconductor body. The fin can be comprised within a stacked vertical transport field effect transistor device. The apparatus can also comprise a dielectric anchor extending from the semiconductor body and adjacent to the fin. Further, the dielectric anchor can be coupled to the fin.

According to an embodiment, a method is provided. The method can comprise etching a semiconductor body to form a fin and a dielectric anchor. The dielectric anchor can be adjacent and coupled to the fin. Further, the dielectric anchor can provide postural support to the fin. The method can also comprise forming a stacked vertical transport field effect transistor device on the semiconductor body. The fin can be comprised within the stacked vertical transport field effect transistor device.

According to an embodiment, an apparatus is provided. The apparatus can comprise a first vertical transport field effect transistor stacked on a second vertical transport field effect transistor. The apparatus can also comprise a fin extending from a semiconductor body. The fin can be comprised within both the first vertical transport field effect transistor and the second vertical transport field effect transistor. Further, the apparatus can comprise a dielectric anchor extending from the semiconductor body and adjacent to the fin. The dielectric anchor can provide postural support to the fin.

BRIEF DESCRIPTION OF THE DRAWINGS

FIG. 11 illustrates a flow diagram of an example, non-limiting method that can facilitate manufacturing of a semiconductor device comprising one or more anchors that can provide postural support to one or more stacked VTFET devices in accordance with one or more embodiments described herein.

DETAILED DESCRIPTION

Figure 1:
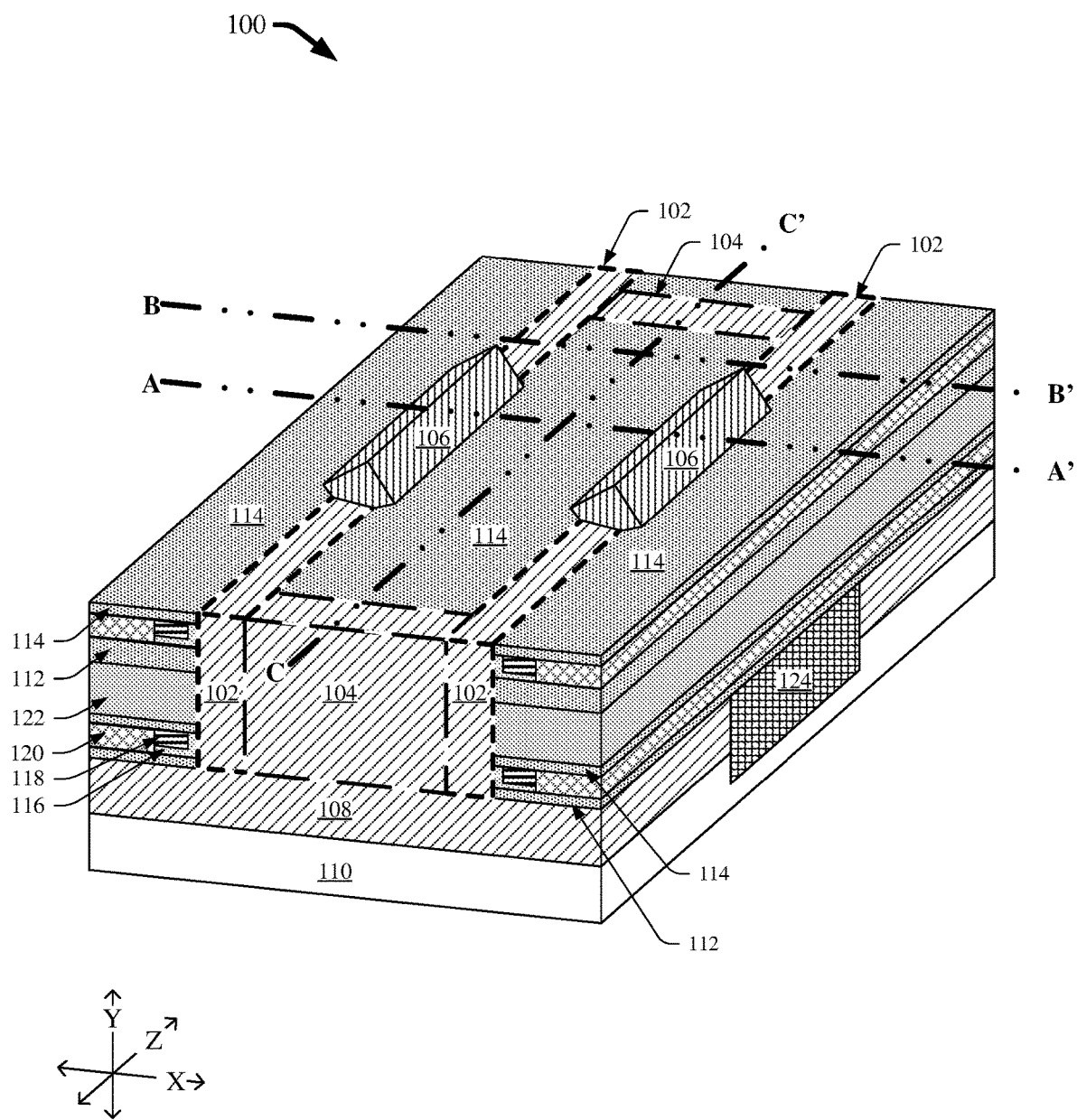
FIG. 1 illustrates a diagram of an example, non-limiting semiconductor device comprising one or more anchors that can provide postural support to one or more stacked VTFET devices in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials.

Stacked VTFET devices comprise one or more VTFETs stacked on top of another VTFET. The stacked structure can enable more VTFETs to be comprised within a given circuitry footprint than would otherwise be possible if the VTFETs were arranged laterally. Additionally, the VTFETs comprised within a stacked VTFET device can share a common fin structure. However, the stacked structure requires fins to extend to greater heights than required by VTFETs positioned in lateral arrangements (e.g., the height of the fin must be high enough to accommodate two or more VTFETs). This extra fin height can challenge the structural stability of the fin and/or cause the fin to buckle, bend, and/or fold (e.g., flop over) during manufacturing of the stacked VTFET device.

Various embodiments described herein can regard semiconductor devices comprising one or more stacked VTFET devices that have enhanced postural support. For example, the one or more stacked VTFET devices described herein can comprise a fin that is supported by one or more anchors. The one or more anchors can comprise a dielectric material and/or can be integrated into one or more portions of the fin (e.g., positioned adjacent to, and/or coupled with, one or more portions of the fin). Further, the one or more anchors can provide postural support to the fin during manufacturing of the one or more stacked VTFET devices; thereby preventing the fin's extra height (e.g., necessitated by the stacked structure of the stacked VTFET device) from compromising the fin's structural integrity. Moreover, one or more embodiments can regard various methods that can facilitate manufacturing the one or more semiconductor devices (e.g., including the one or more anchors, fins, and/or stacked VTFET devices).

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "epitaxial growth process" and/or "epitaxial growth processes" can refer to any process that grows an epitaxial material (e.g., a crystalline semiconductor material) on a deposition surface of another semiconductor material, in which the epitaxial material being grown has substantially the same crystalline characteristics as the semiconductor material of the deposition surface. In an epitaxial deposition process, chemical reactants provided by source gases (e.g., a silicon and/or germanium containing gas) and/or source liquids can be controlled, and the system parameters can be set, so that the depositing atoms arrive at the deposition surface with sufficient energy to move about on the surface and orient themselves to the crystal arrangement of the atoms of the deposition surface. Therefore, the grown epitaxial material can have substantially the same crystalline characteristics as the deposition surface on which the epitaxial material is formed. For example, an epitaxially grown semiconductor material deposited on a <100> orientated crystalline surface can take on a <100> orientation. Example epitaxial growth processes can include, but are not limited to: vapor-phase epitaxy ("VPE"), molecular-beam epitaxy ("MBE"), liquid-phase epitaxy ("LPE"), a combination thereof, and/or the like.

As described herein, the terms "etching process", "etching processes", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein, the terms "lithography process" and/or "lithography processes" can refer to the formation of three-dimensional relief images or patterns on a semiconductor substrate for subsequent transfer of the pattern to the substrate. In semiconductor lithography, the patterns can be formed by a light sensitive polymer called a photo-resist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

FIG. 1 illustrates a diagram of an example, non-limiting semiconductor device 100 that can comprise one or more stacked VTFET devices in accordance with one or more embodiments described herein. Repetitive description of like elements employed in other embodiments described herein is omitted for sake of brevity. As shown in FIG. 1, the semiconductor device 100 can comprise one or more fins 102 adjacent to one or more anchors 104. In one or more embodiments, the one or more anchors 104 can be extensions of the one or more fins 102. For clarity, the one or more fins 102 and/or anchors 104 are delineated with dashed lines in FIG. 1.

Although FIG. 1 depicts a semiconductor device 100 comprising two fins 102, the architecture is not so limited. For example, the semiconductor device 100 can comprise a single fin 102 or a plurality of fins 102 (e.g., two or more fins 102). One of ordinary skill in the art will readily recognize that the number of fins 102 comprised within the semiconductor device 100 can depend on the function and/or application of the semiconductor device 100. Additionally, one or more of the fins 102 can comprise one or more isolation regions and/or device regions. One or more stacked VTFET devices can be positioned within the one or more device regions of the fin 102, whereas the one or more isolation regions can be adjacent to the one or more stacked VTFET devices and/or can serve to at least partially isolate the one or more stacked VTFET devices (e.g., electrically isolated the stacked VTFET devices from adjacent semiconductor features (not shown) that can be comprised within the semiconductor device 100). For example, the plane A-A' shown in FIG. 1 can be comprised within the one or more device regions of the one or more fins 102, and/or the plane B-B' can be comprised within the one or more isolation regions of the one or more fins 102. As shown in FIG. 1, the one or more isolation regions of the one or more fins 102 are visible, while the one or more device regions are capped by one or more top source/drain regions 106 of the stacked VTFET devices.

In various embodiments, the one or more anchors 104 can be positioned adjacent to the one or more fins 102 and/or can be coupled to the one or more isolation portions of the one or more fins 102 (e.g., as shown in FIG. 1). Although FIG. 1 depicts a semiconductor device 100 comprising two anchors 104, the architecture is not so limited. For example, the semiconductor device 100 can comprise a single anchor 104 or a plurality of anchors 104 (e.g., two or more anchors 104). Further, as shown in FIG. 1, the one or more anchors 104 can be positioned at the ends of the one or more fins 102 and/or at any position between the fin's 102 end and device region.

The one or more fins 102 and/or anchors 104 can extend from a semiconductor body that can comprise one or more dielectric layers 108 and/or semiconductor substrates 110. The semiconductor substrate 110 can be crystalline, semi-crystalline, microcrystalline, or amorphous. The semiconductor substrate 110 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like. The semiconductor substrate 110 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the semiconductor substrate 110 can also have other layers, such as oxides with high dielectric constants ("high-K oxides") and/or nitrides. In one or more embodiments, the semiconductor substrate 110 can be a silicon wafer. In various embodiments, the semiconductor substrate 110 can comprise a single crystal silicon (Si), silicon germanium (e.g., characterized by the chemical formula SiGe), a Group III-V semiconductor wafer or surface/active layer, a combination thereof, and/or the like.

In various embodiments, the one or more anchors 104 can extend from the semiconductor body to a height that is equivalent, or nearly equivalent, to the height of the one or more fins 102. In some embodiments, the one or more anchors 104 can extend from the semiconductor body to a height that is a fraction of the height of the one or more fins 102 (e.g., half or a quarter of the height of the one or more fins 102). Additionally, wherein the semiconductor device 100 comprises a plurality of anchors 104, the plurality of anchors 104 can comprise anchors 104 of the same height or varying heights. The one or more anchors 104 can have a thickness (e.g., along the "Z" axis) ranging, for example, from greater than or equal to 50 nm and less than or equal to 200 nm. Wherein the semiconductor device 100 comprises a plurality of anchors 104, the plurality of anchors 104 can have thicknesses (e.g., along the "Z" axis) of the same thickness or of varying thicknesses.

In one or more embodiments, the one or more anchors 104 can comprise a dielectric material. Example dielectric materials that can be comprised within the one or more anchors 104 can include, but are not limited to: silaketenylidene (e.g., characterized by the chemical formula SiCO), silicon oxycarbonitride (e.g., characterized by the chemical formula SiOCN), silicon nitride, carbo-doped silicon oxide, silicon-boron carbonitride, silicon oxynitride, a combination thereof, and/or the like. In various embodiments, the one or more anchors 104 can have the same, or substantially the same, material composition as the one or more isolation regions of the one or more fins 102 (e.g., as shown in FIG. 1). Additionally, the one or more anchors 104 can have the same, or substantially the same, material composition as the one or more dielectric layers 108 of the semiconductor body (e.g., as shown in FIG. 1). For instance, example materials that can be comprised within the one or more isolation regions of the one or more fins 102 can include, but are not limited to: SiCO, SiOCN, silicon nitride, carbo-doped silicon oxide, silicon-boron carbonitride, silicon oxynitride, a combination thereof, and/or the like. Also, example materials that can be comprised within the one or more dielectric layers 108 can include, but are not limited to: SiCO, SiOCN, silicon nitride, carbo-doped silicon oxide, silicon-boron carbonitride, silicon oxynitride, a combination thereof, and/or the like.

The one or more anchors 104 can provide postural support to the one or more fins 102. In other words, the one or more anchors 104 can facilitate maintaining the posture, stability, and/or structural integrity of the one or more fins 102. For example, the one or more anchors 104 can provide enhanced rigidity to the one or more fins 102 (e.g., as compared to fins 102 not coupled to anchors 104) to help prevent and/or inhibit the fins 102 from buckling, bending, and/or folding (e.g., flopping over). Advantageously, the postural support provided by the one or more anchors 104 can enable the use of tall fins 102 during various manufacturing stages of a stacked VTFET device where the fins 102 would otherwise be free-standing and susceptible to instability.

Additionally, the semiconductor device 100 can comprise: a plurality of bottom spacers 112, a plurality of top spacers 114, a plurality of gate dielectric layers 116, a plurality of gate metal layers 118, a plurality of interlayer dielectrics ("ILDs") 120, and/or one or more isolation layers 122. As shown in FIG. 1, the plurality of bottom spacers 112, top spacers 114, gate dielectric layers 116, gate metal layers 118, ILDs 120, and/or isolation layers 122 can be stacked onto the semiconductor body and positioned adjacent to the one or more fins 102 and/or anchors 104. For example, the plurality of bottom spacers 112, top spacers 114, gate dielectric layers 116, gate metal layers 118, ILDs 120, and/or isolation layers 122 can be laterally adjacent to opposing sidewalls of the one or more fins 102 along the "X" axis. Additionally, the plurality of bottom spacers 112, top spacers 114, gate dielectric layers 116, gate metal layers 118, ILDs 120, and/or isolation layers 122 can be positioned between adjacent fins 102 and/or anchors 104.

The one or more isolation layers 122 can separate VTFETs comprised within the stacked VTFET device facilitated by the respective fins 102. For example, the one or more isolation layers 122 can be positioned between a top VTFET and a bottom VTFET in a stacked VTFET device, wherein one or more of the fins 102 can be comprised within both the top VTFET and the bottom VTFET. In various embodiments, the one or more isolation layers 122 can comprise a p-type dopant or an n-type dopant to facilitate a p-n junction isolation. The one or more isolation layers 122 can electrically isolate the various VTFETs comprised within the stacked VTFET devices from each other. For example, the one or more isolation layers 122 can electrically isolate a top VTFET of a stacked VTFET device from a bottom VTFET of the stacked VTFET device (e.g., as shown in FIG. 1).

The plurality of bottom spacers 112 can be positioned at the base of the respective VTFETs comprised within a stacked VTFET device. For example, one or more bottom spacers 112 can be positioned on the semiconductor body (e.g., the dielectric layer 108) at the base of a bottom VTFET of a stacked VTFET device. Further, one or more bottom spacers 112 can be positioned on the one or more isolation layers 122 at the base of a top VTFET of the stacked VTFET device. As described herein, a fin 102 can extend within both the top and bottom VTFETs and the plurality of bottom spacers 112 can be positioned adjacent to the fin 102 (e.g., as shown in FIG. 1). Example materials that can be comprised within the plurality of bottom spacers 112 can include, but are not limited to: silicon nitride (e.g., characterized by the chemical formula SiN), silicon oxide (e.g., characterized by the chemical formula SiO), silicon oxynitride (e.g., characterized by the chemical formula SiON), a combination thereof, and/or the like.

A plurality of gates can be positioned on the plurality of bottom spacers 112. The plurality of gates can be comprised within the VTFETs. Additionally, the plurality of gates can comprise the plurality of gate dielectric layers 116, the plurality of gate metal layers 118, and/or a plurality of work function metals ("WFM") (not shown). As shown in FIG. 1, within each gate, a gate dielectric layer 116 can be positioned adjacent to the fin 102 of the respect VTFET and a bottom spacer 112 of the VTFET. Additionally, within each gate, a gate metal layer 118 can be positioned on the gate dielectric layer 116 such that the gate dielectric layer 116 is located between: the gate metal layer 118 and the bottom spacer 112; and the gate metal layer 118 and the fin 102. In various embodiments, a WFM can further be positioned between the gate metal layer 118 and the gate dielectric layer 116. Thereby, the combination of a gate metal layer 118, a gate dielectric layer 116, and/or a WFM can constitute a gate for one or more VTFETs. As shown in FIG. 1, the semiconductor device 100 can comprise a plurality of gates positioned adjacent to a common fin 102 to facilitate a stacked VTFET device. For example, as shown in FIG. 1, one or more gates positioned adjacent to a fin 102 and below the isolation layer 122 can be comprised within the bottom VTFET of the stacked VTFET device facilitated by the fin 102; and/or one or more gates positioned adjacent to the subject fin 102 and above the isolation layer 122 can be comprised within the top VTFET of the subject stacked VTFET device.

In various embodiments, the plurality of gate dielectric layers 116 can be characterized by a high dielectric constant (e.g., can be a "high-K" dielectric material). Example materials that can be comprised within the plurality of gate dielectric layers 116 can include, but is not limited to: metal oxides such as hafnium oxide (e.g., characterized by the chemical formula $HfO_2$), hafnium silicon oxide (e.g., characterized by the chemical formula $HfSiO_4$), hafnium silicon oxynitride (characterized by the chemical formula $Hf_wSi_xO_yN_z$), lanthanum oxide (e.g., characterized by the chemical formula $La_2O_3$), lanthanum aluminum oxide (e.g., characterized by the chemical formula $LaALO_3$), zirconium oxide (e.g., characterized by the chemical formula $ZrO_2$), zirconium silicon oxide (e.g., characterized by the chemical formula $ZrSiO_4$), zirconium silicon oxynitride (e.g., characterized by the chemical formula $Zr_wSi_xO_yN_z$), tantalum oxide (e.g., characterized by the chemical formula $TaO_2$, $Ta_2O$), titanium oxide (e.g., characterized by the chemical formula $TiO_2$), barium strontium titanium oxide (e.g., characterized by the chemical formula $BaTiO_3$—$SrTiO_3$), barium titanium oxide (e.g., characterized by the chemical formula $BaTiO_3$), strontium titanium oxide (e.g., characterized by the chemical formula $SrTiO_3$), yttrium oxide (e.g., characterized by the chemical formula $Y_2O_3$), aluminum oxide (e.g., characterized by the chemical formula $Al_2O_3$), lead scandium tantalum oxide (e.g., characterized by the chemical formula $Pb(Sc_xTa_{1-x})O_3$), lead zinc niobate (e.g., characterized by the chemical formula $PbZn_{1/3}Nb_{2/3}O_3$), a combination thereof, and/or the like. Also, the plurality of gate dielectric layers 116 can further include dopants such as lanthanum and/or aluminum. The stoichiometry of the high-K dielectric materials comprised within the plurality of gate dielectric layers 116 can vary. In various embodiments, the plurality of gate dielectric layers 116 can have a thickness (e.g., along the "Y" axis) ranging, for example, about greater than or equal to 1.5 nanometers (nm) and less than or equal to about 2.5 nm.

In various embodiments, the plurality of gate metal layers 118 can comprise tungsten (W), cobalt (Co), a combination thereof, and/or the like. In some embodiments, the plurality of gate metal layers 118 can serve as gate electrodes. Additionally, one or more WFM (not shown) can be comprised within the gates between the gate metal layers 118 and the gate dielectric layers 116. Example materials that can be comprised within the one or more WFM can include, but are not limited to: titanium nitride (e.g., characterized by the chemical formula TiN), hafnium nitride (e.g., characterized by the chemical formula HfN), hafnium silicon nitride (e.g., characterized by the chemical formula HfSiN), tantalum nitride (e.g., characterized by the chemical formula TaN), tantalum silicon nitride (e.g., characterized by the chemical formula TaSiN), tungsten nitride (e.g., characterized by the chemical formula WN), molybdenum nitride (e.g., characterized by the chemical formula MoN), niobium nitride (e.g., characterized by the chemical formula NbN), a carbide, titanium carbide (e.g., characterized by the chemical formula TiC), tantalum carbide (e.g., characterized by the chemical formula TaC), hafnium carbide (e.g., characterized by the chemical formula HfC), and combinations thereof, and/or the like.

The plurality of ILDs 120 can also be positioned on the plurality of bottom spacers 112 and/or adjacent to the gates. As shown in FIG. 1, the gates can be positioned between ILDs 120 and a fin 102. Example materials that can be comprised within the one or more ILDs 120 can include, but are not limited to: silicon dioxide (e.g., characterized by the chemical formula $SiO_2$), silicon nitride (e.g., characterized by the chemical formula SiN), silicon oxynitride (e.g., characterized by the chemical formula SiON), a low-k dielectrics, a combination thereof, and/or the like. The plurality of ILDs 120 can serve to insulate one or more features of the semiconductor device 100.

The plurality of top spacers 114 can be positioned at the top of the respective VTFETs comprised within a stacked VTFET device. For example, one or more top spacers 114 can be positioned on the ILDs 120 and/or gates at the top of the VTFETs. As described herein, a fin 102 can extend within both the top and bottom VTFETs and the plurality of top spacers 114 can be positioned adjacent to the fin 102 (e.g., as shown in FIG. 1). Example materials that can be comprised within the plurality of top spacers 114 can include, but are not limited to: silicon nitride (e.g., characterized by the chemical formula SiN), silicon oxide (e.g., characterized by the chemical formula SiO), silicon oxynitride (e.g., characterized by the chemical formula SiON), a combination thereof, and/or the like.

Additionally, the semiconductor device 100 can comprise one or more shallow trench isolations ("STIs") 124. The one or more STIs 124 can be positioned adjacent to the one or more stacked VTFET devices. Further, the one or more STIs 124 can at least partially isolate adjacent stacked VTFET devices from each other. In various embodiments, the one or more STIs 124 can comprise one or more dielectric materials, such as silicon dioxide.

Figure 2:
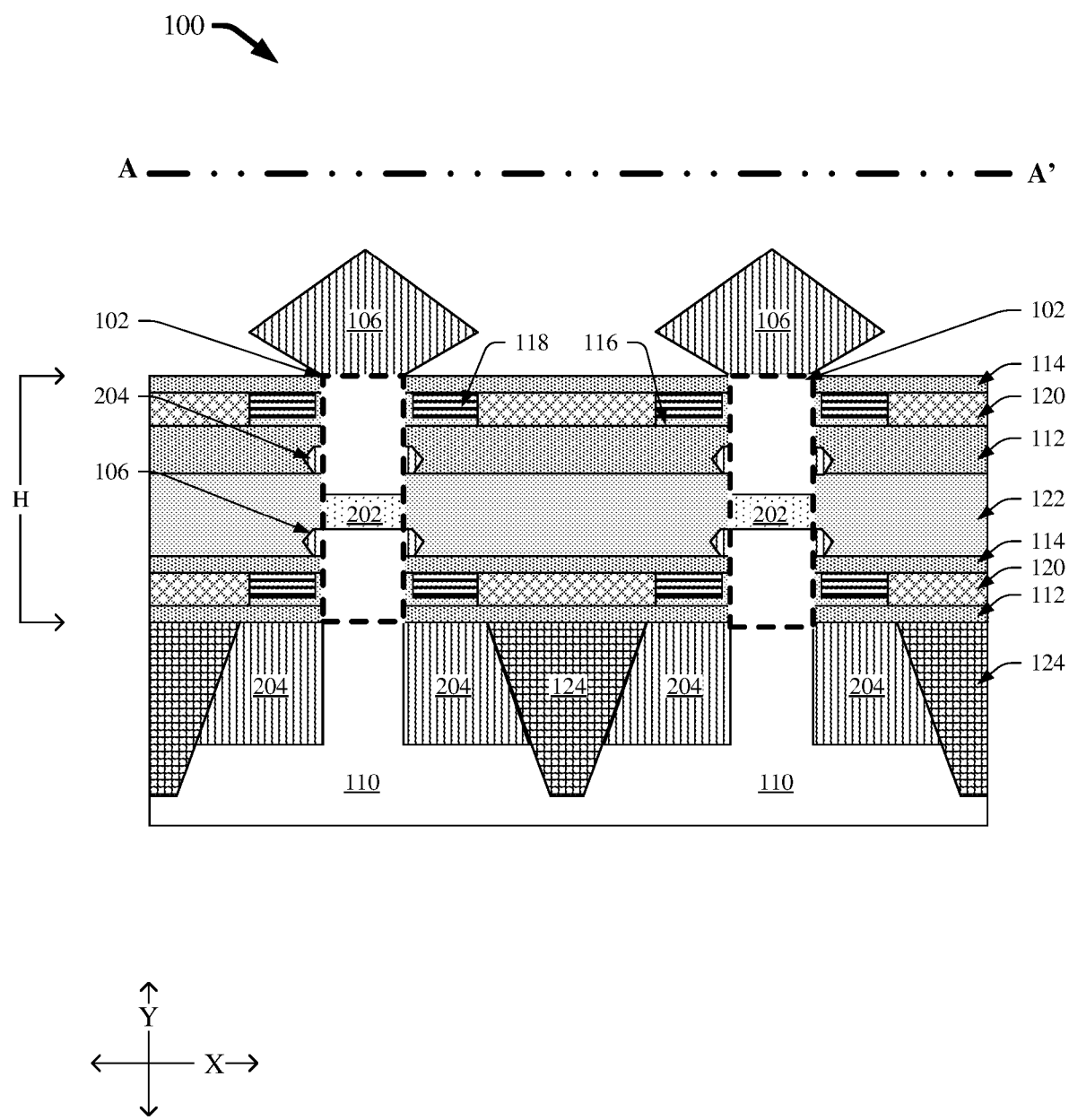
FIG. 2 illustrates a diagram of an example, non-limiting cross-sectional view of one or more stacked VTFET devices with enhanced postural support in accordance with one or more embodiments described herein.

FIG. 2 illustrates a diagram of the example, non-limiting semiconductor device 100 along the A-A' plane delineated in FIG. 1 in accordance with one or more embodiments described herein. Repetitive description of like elements employed in other embodiments described herein is omitted for sake of brevity. FIG. 2 depicts a cross-sectional view of the semiconductor device 100 within the device regions of the one or more fins 102. For example, FIG. 2 depicts a cross-section of the one or more stacked VTFET devices comprised within the semiconductor device 100.

As shown in FIG. 2, the one or more fins 102 can extend from the semiconductor substrate 110 in the one or more device regions. Also, the one or more fins 102 can have a material composition within the device regions that is the same, or substantially the same, as the semiconductor substrate 110. In addition, the one or more fins 102 can comprise one or more insulator layers 202 within the one or more device regions (e.g., as shown in FIG. 2). The one or more insulator layers 202 can separate a first portion of a fin 102 from a second portion of the subject fin 102. Further, the first portion of the fin 102 can be comprise within a first VTFET of a stacked VTFET device, while the second portion of the fin 102 can be comprised within a second VTFET of the stacked VTFET device. For example, the first portion of the fin 102 can be comprise within a bottom VTFET of a stacked VTFET device, while the second portion of the fin 102 can be comprised within a top VTFET of the stacked VTFET device. In addition, the one or more insulator layers 202 can electrically isolate the first portion of the fin 102 from the second portion of the fin 102; thereby at least partially isolating the VTFETs comprised within the stacked VTFET device. The one or more insulator layers 202 can comprise an electrically insulating oxide, such as silicon dioxide.

Also shown in FIG. 2, each of the VTFETs comprised within a stacked VTFET device can comprise one or more top source/drain regions 106 and/or one or more bottom source/drain regions 204. For example, wherein the stacked VTFET device comprises a bottom VTFET and a top VTFET, one or more top source/drain regions 106 for the bottom VTFET can be comprised within the one or more isolation layers 122 and/or one or more bottom source/drain regions 204 for the bottom VTFET can be positioned adjacent to the semiconductor substrate 110 (e.g., as shown in FIG. 2). Additionally, one or more top source/drain regions 106 for the top VTFET can be positioned on top of the fin 102 and/or one or more bottom source/drain regions 204 for the bottom VTFET can be comprised within the one or more bottom spacers 112 of the top VTFET (e.g., as shown in FIG. 2).

In various embodiments, the one or more bottom source/drain regions 204 for the bottom most VTFET of the stacked VTFET device can be position between the semiconductor substrate 110 and the one or more bottom spacers 112 of the subject VTFET. The plurality of top source/drain regions 106 and/or bottom source/drain regions 204 comprised within the one or more stacked VTFET devices can comprise epitaxial materials deposited via one or more epitaxial growth processes. As shown in FIG. 2, the one or more STIs 124 can be positioned adjacent to the one or more bottom source/drain regions 204. The one or more STIs 124 can serve to electrically isolate one or more bottom source/drain regions 204 of one bottom VTFET from one or more bottom source/drain regions 204 of another bottom VTFET (e.g., comprised within an adjacent stacked VTFET device).

Furthermore, the "H" arrow depicted in FIG. 2 can delineate the height of the one or more fins 102. In various embodiments, the one or more fins 102 can have a height ranging, for example, greater than or equal to 25 nm and less than or equal to 250 nm. In one or more embodiments, the one or more fins 102 can have a height greater than 250 nm depending on the number of VTFETs comprised within the one or more stacked VTFET devices. Also, in one or more embodiments, the height of the one or more fins 102 (e.g., delineated by the "H" arrow in FIG. 2) can also be the height of the one or more stacked VTFET devices.

Figure 3:
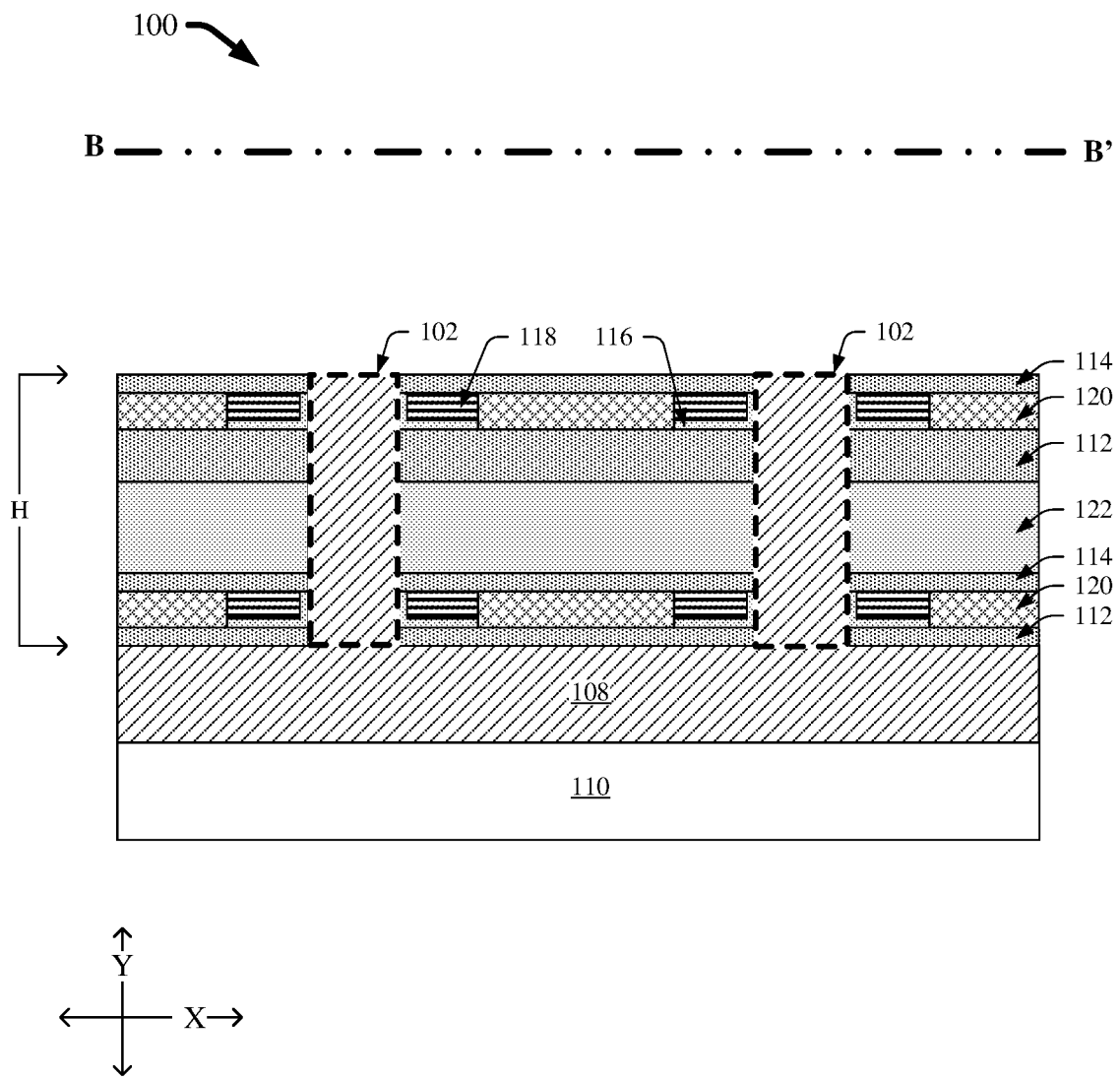
FIG. 3 illustrates a diagram of an example, non-limiting cross-sectional view of one or more fins that can be at least partially supported by one or more adjacent anchors in accordance with one or more embodiments described herein.

FIG. 3 illustrates a diagram of the example, non-limiting semiconductor device 100 along the B-B' plane delineated in FIG. 1 in accordance with one or more embodiments described herein. Repetitive description of like elements employed in other embodiments described herein is omitted for sake of brevity. FIG. 3 depicts a cross-sectional view of the semiconductor device 100 within the isolation regions of the one or more fins 102.

As shown in FIG. 3, the one or more fins 102 can extend from the one or more dielectric layers 108 in the one or more isolation regions. Also, the one or more fins 102 can have a material composition within the isolation regions that is the same, or substantially the same, as the one or more dielectric layers 108. Additionally, the one or more isolation regions of the fins 102 can be free from the one or more insulator layers 202 comprised within the one or more device regions. In various embodiments, the one or more fins 102 can have the same height (e.g., delineated by the "H" arrow) in the one or more isolation regions as the one or more device regions.

Figure 4:
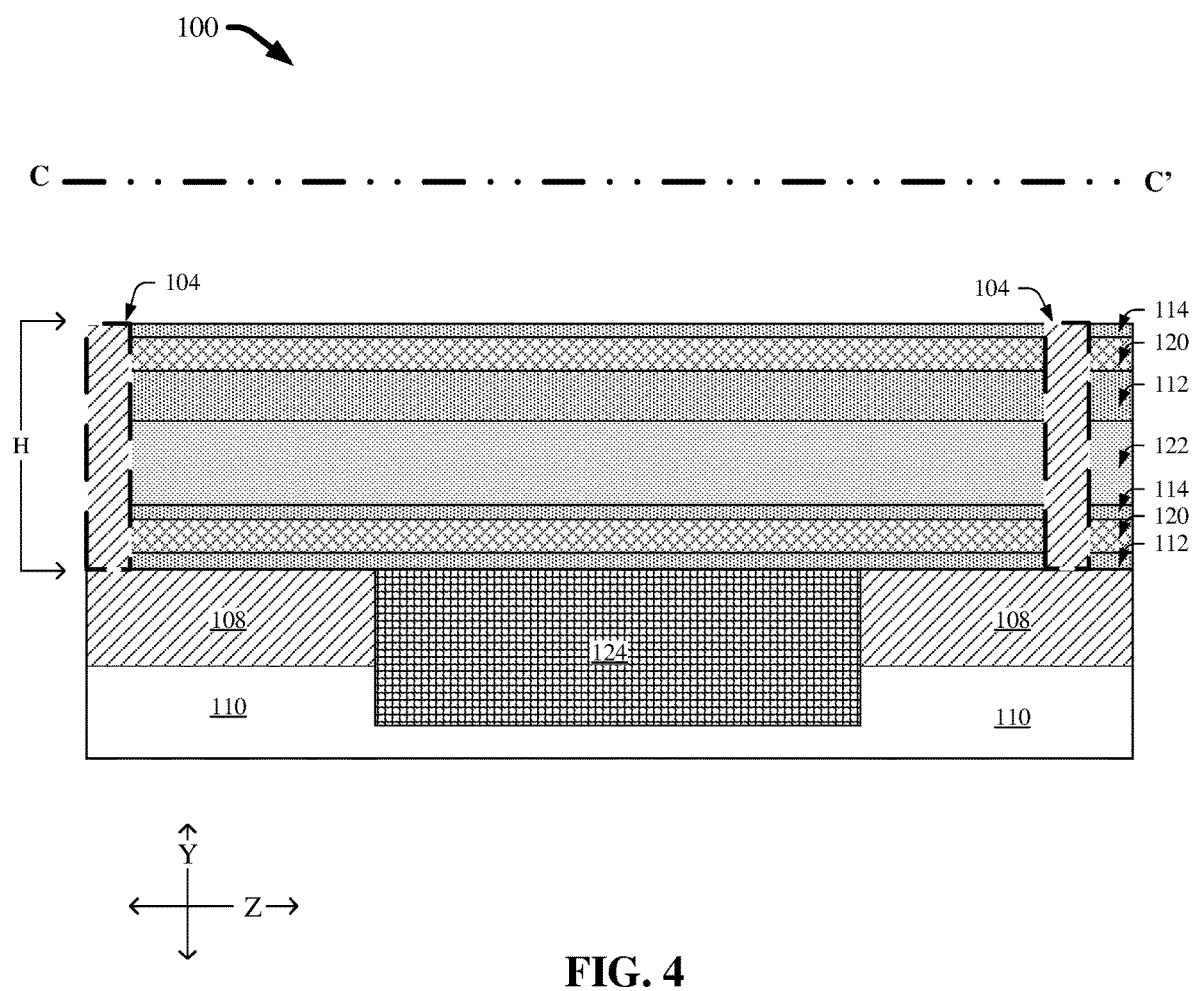
FIG. 4 illustrates a diagram of an example, non-limiting cross-sectional view of one or more anchors that can provide postural support to one or more stacked VTFET devices in accordance with one or more embodiments described herein.

FIG. 4 illustrates a diagram of the example, non-limiting semiconductor device 100 along the C-C' plane delineated in FIG. 1 in accordance with one or more embodiments described herein. Repetitive description of like elements employed in other embodiments described herein is omitted for sake of brevity. FIG. 4 depicts a cross-sectional view of the semiconductor device 100 between the two fins 102 shown in FIG. 1.

As shown in FIG. 4, the one or more anchors 104 can extend from the one or more dielectric layers 108 in the one or more isolation regions. Also, the one or more anchors 104 can have a material composition that is the same, or substantially the same, as the one or more dielectric layers 108. In various embodiments, the one or more anchors 104 can have the same height (e.g., delineated by the "H" arrow) as the one or more fins 102. Further, FIG. 4 demonstrates that the one or more anchors 104 can be positioned in various locations within the one or more isolation regions of the one or more fins 102.

Figure 5:
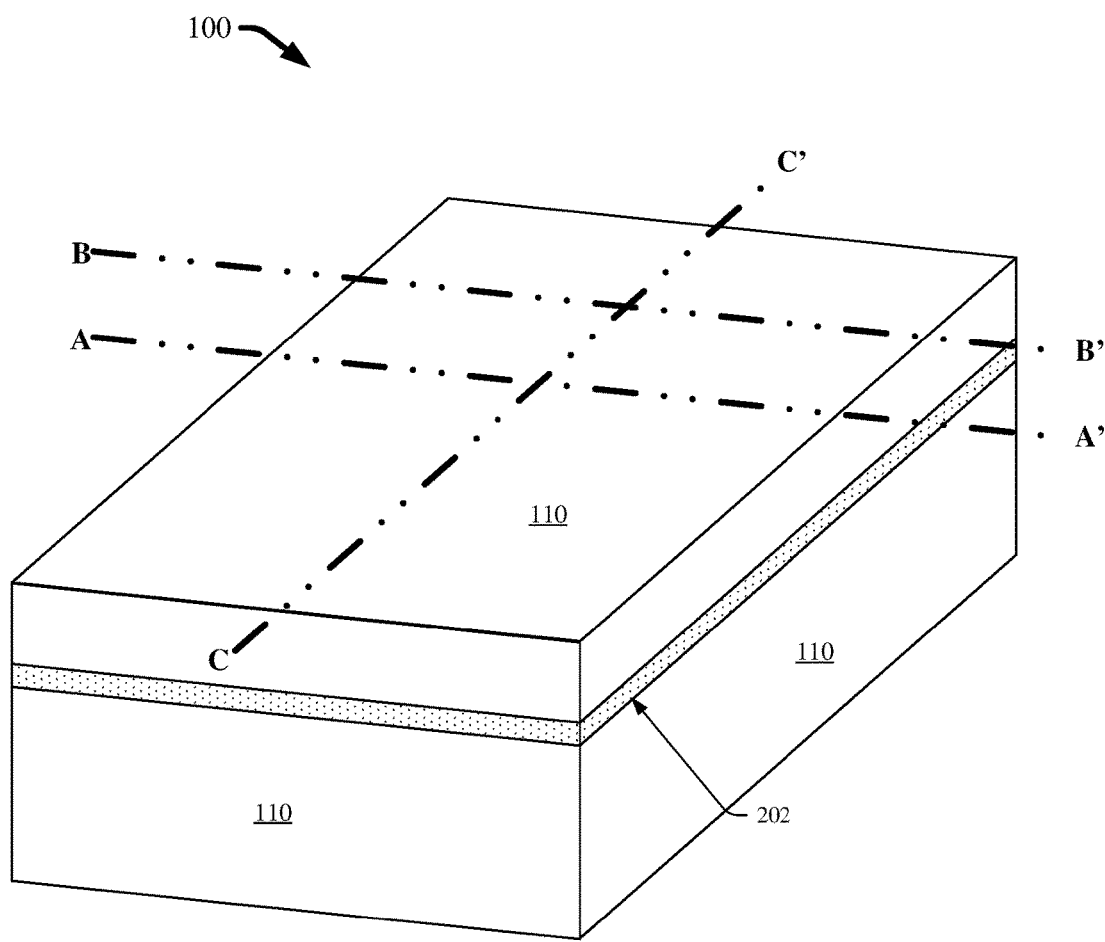
FIG. 5 illustrates a diagram of an example, non-limiting semiconductor device during a first stage of manufacturing, wherein the semiconductor device can comprise one or more anchors that can provide postural support to one or more stacked VTFET devices in accordance with one or more embodiments described herein.

FIG. 5 illustrates a diagram of the example, non-limiting semiconductor device 100 during a first stage of manufacturing in accordance with one or more embodiments described herein. Repetitive description of like elements employed in other embodiments described herein is omitted for sake of brevity. As shown in FIG. 5, the semiconductor device 100 can be manufactured from a SOI substrate, wherein the insulator layer 202 can be buried oxide layer.

Figure 6:
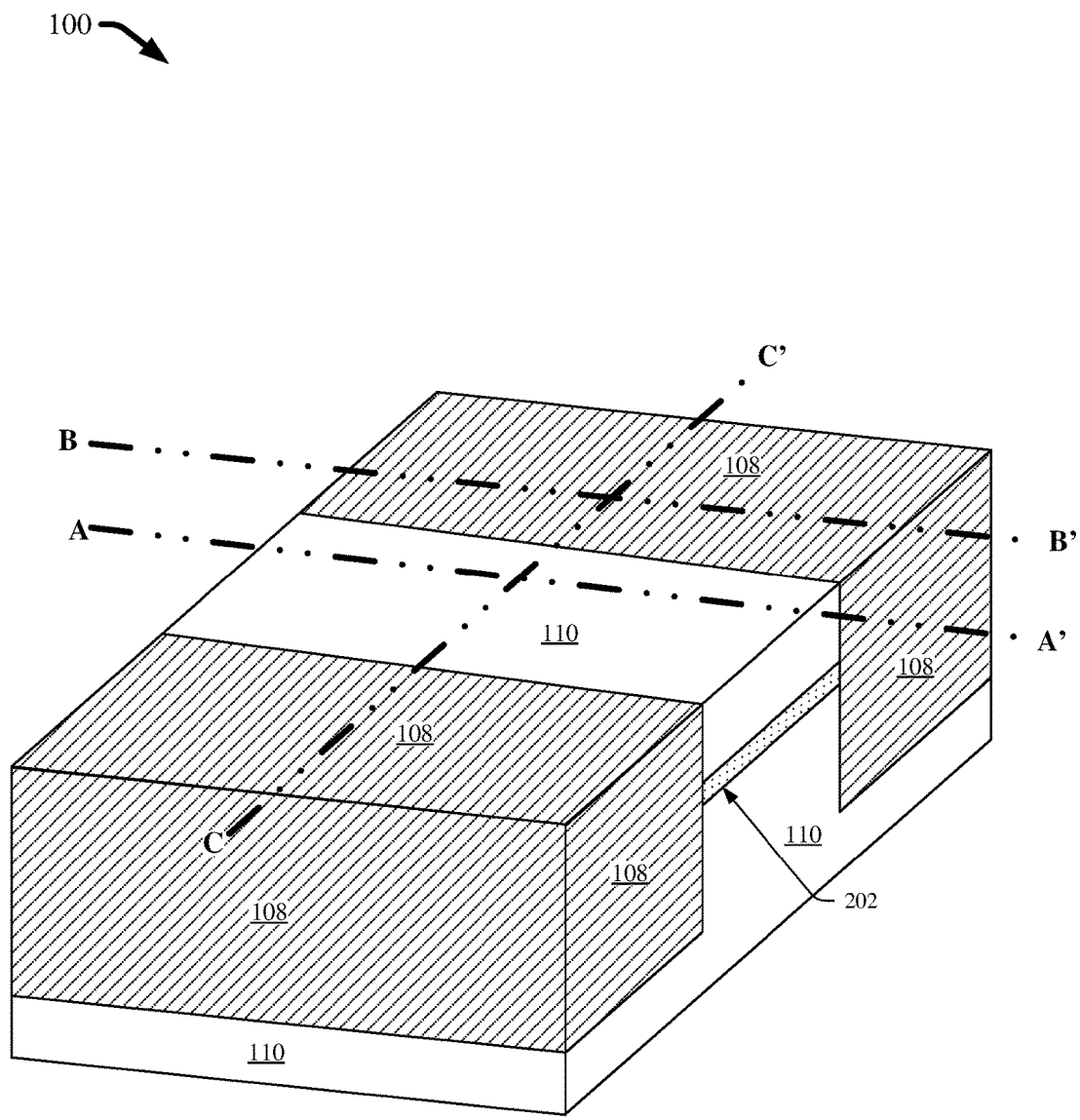
FIG. 6 illustrates a diagram of an example, non-limiting semiconductor device during a second stage of manufacturing, wherein the semiconductor device can comprise one or more anchors that can provide postural support to one or more stacked VTFET devices in accordance with one or more embodiments described herein.

FIG. 6 illustrates a diagram of the example, non-limiting semiconductor device 100 during a second stage of manufacturing in accordance with one or more embodiments described herein. Repetitive description of like elements employed in other embodiments described herein is omitted for sake of brevity. As shown in FIG. 6, the second stage of manufacturing can comprise replacing one or more portions of the SOI substrate with one or more dielectric layers 108.

For example, one or more portions of the SOI substrate that correspond to the future locations of the one or more isolation regions of the fins 102 can be removed via one or more etching processes (e.g., RIE). The remaining SOI substrate material can comprise the semiconductor substrate 110 comprised within the semiconductor body and/or the device regions of the one or more fins 102 of the semiconductor device 100. Subsequent to the one or more etching processes, the one or more dielectric layers 108 can be deposited onto the semiconductor substrate 110 via one or more deposition processes (e.g., CVD and/or PECVD). In various embodiments, the etching and/or deposition processes at the second stage of manufacturing can create a semiconductor body (e.g., comprising the one or more dielectric layers 108 and/or semiconductor substrate 110) from which the one or more fins 102 and/or anchors 104 can be formed.

Figure 7:
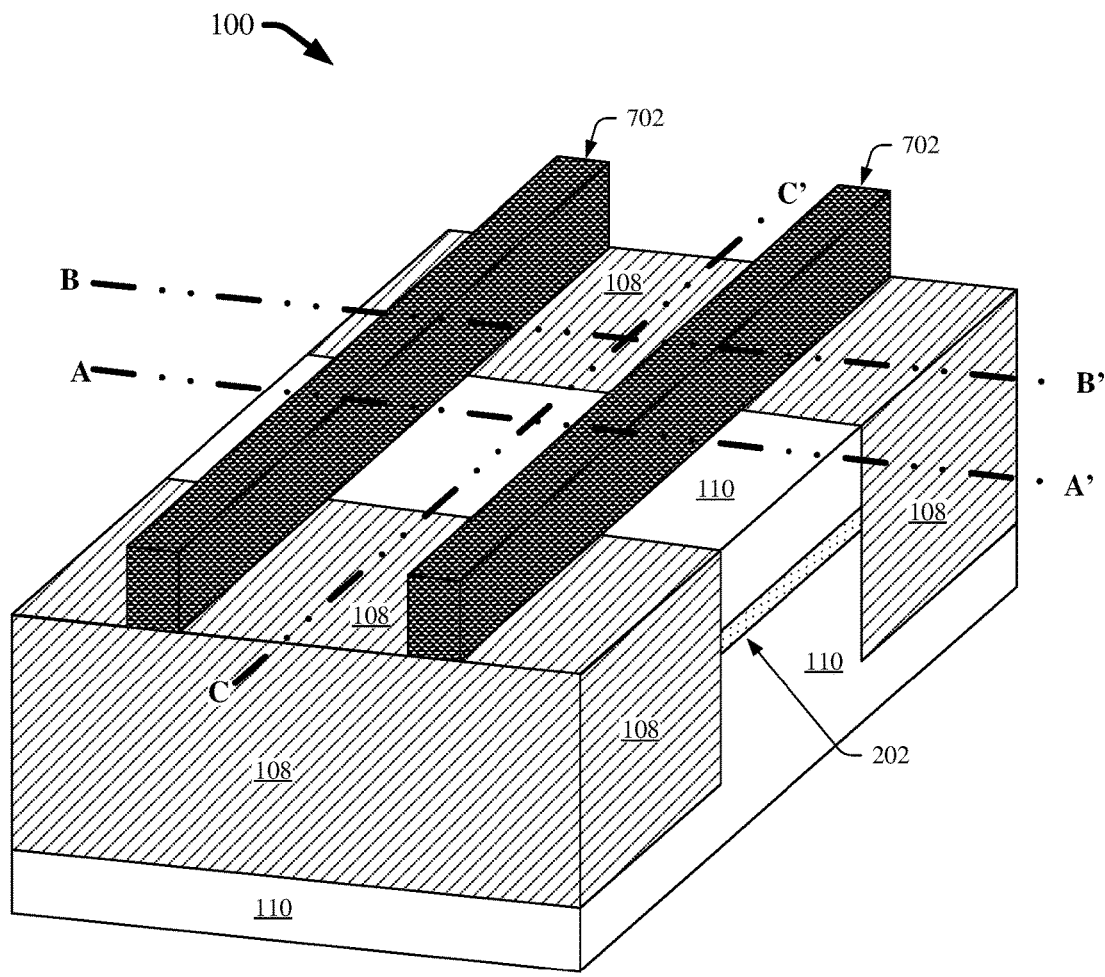
FIG. 7 illustrates a diagram of an example, non-limiting semiconductor device during a third stage of manufacturing, wherein the semiconductor device can comprise one or more anchors that can provide postural support to one or more stacked VTFET devices in accordance with one or more embodiments described herein.

FIG. 7 illustrates a diagram of the example, non-limiting semiconductor device 100 during a third stage of manufacturing in accordance with one or more embodiments described herein. Repetitive description of like elements employed in other embodiments described herein is omitted for sake of brevity. As shown in FIG. 7, the third stage of manufacturing can comprise depositing one or more fin mask layers 702 onto the semiconductor body.

The one or more fin mask layers 702 can delineate the positions of the one or more fins 102 to be formed from the semiconductor body. As shown in FIG. 7, the one or more fin mask layers 702 can be deposited along the length of the semiconductor device 100 (e.g., along the "Z" axis), such that the position of the one or more fins 102 can extend through the one or more isolation regions (e.g., comprising the one or more dielectric layers 108) and device regions (e.g., comprising the semiconductor substrate 110 and/or insulator layer 202).

In various embodiments, the one or more fin mask layers 702 can comprise hard mask materials. Example materials that can be comprised within the one or more fin mask layers 702 can include, but are not limited to: an oxide (e.g., silicon oxide), a nitride (e.g., silicon nitride), an oxynitride (e.g., silicon oxynitride), a combination thereof, and/or the like. In one or more embodiments, the one or more fin mask layers 702 can be deposited via one or more deposition processes. In some embodiments, the one or more fin mask layers 702 can be formed via a thermal process (e.g., oxidation and/or nitridation of top surface of the deposition area).

Figure 8:
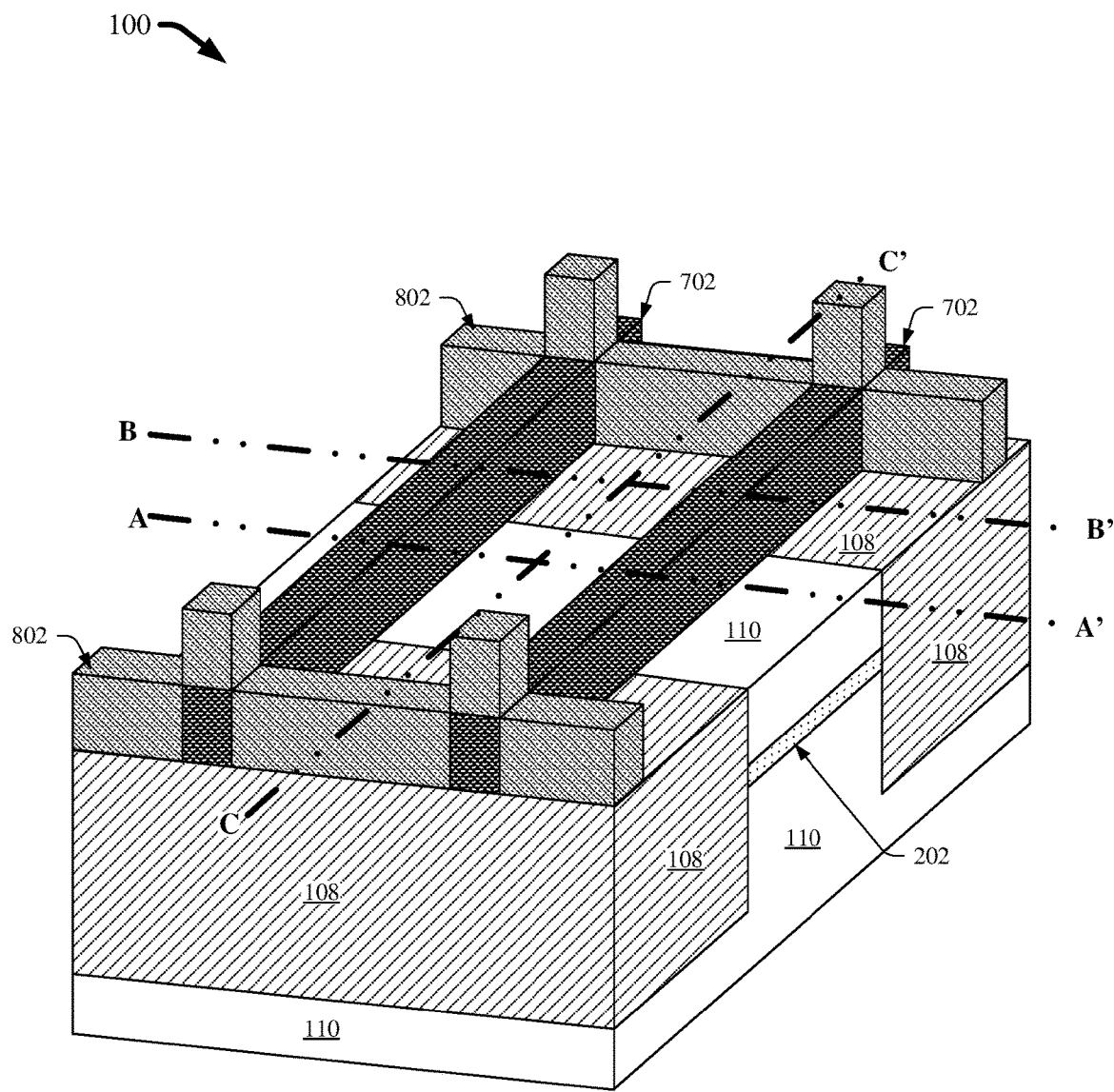
FIG. 8 illustrates a diagram of an example, non-limiting semiconductor device during a fourth stage of manufacturing, wherein the semiconductor device can comprise one or more anchors that can provide postural support to one or more stacked VTFET devices in accordance with one or more embodiments described herein.
Figure 8:
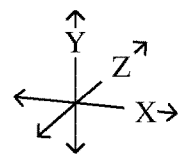

FIG. 8 illustrates a diagram of the example, non-limiting semiconductor device 100 during a fourth stage of manufacturing in accordance with one or more embodiments described herein. Repetitive description of like elements employed in other embodiments described herein is omitted for sake of brevity. As shown in FIG. 8, the fourth stage of manufacturing can comprise depositing one or more anchor mask layers 802 onto the semiconductor body and/or one or more fin mask layers 702.

The one or more anchor mask layers 802 can delineate the positions of the one or more anchors 104 to be formed from the semiconductor body. As shown in FIG. 8, the one or more anchor mask layers 802 can be deposited along the width of the semiconductor device 100 (e.g., along the "X" axis), such that the one or more anchors 104 can be positioned within the isolation regions and/or can extend across the width (e.g., along the "X" axis) of the semiconductor device 100 to contact multiple fins 102.

In various embodiments, the one or more anchor mask layers 802 can comprise one or more organic planarization layers ("OPLs") that can be formed by one or more lithography processes. Example materials that can be comprised within the one or more OPLs can include, but are not limited to: carbon, hydrogen, oxygen, nitrogen, fluorine, silicon, a combination thereof, and/or the like. In one or more embodiments, the one or more OPLs can be self-planarizing.

In one or more embodiments, the position of the fins 102 and/or the anchors 104 can be delineated by a common hard mask layer. For example, a hard mask layer can be deposited onto the semiconductor body, wherein upon one or more lithography processes can pattern one or more photo resist masks onto the hard mask layer. The one or more photo resist masks can be patterned to correspond to the future locations of the one or more fins 102 and/or anchors 104. Further, the one or more photo resist masks can facilitate removal of exposed portions of the hard mask layer (e.g., portions of the hard mask layer that do not delineate the position of the one or more fins 102 and/or anchors 104) via one or more removal processes. Subsequently, the one or more photo resist masks can be removed from the hard mask layer; thereby resulting in a hard mask layer patterned to delineate the position of the one or more fins 102 and/or anchors 104 (e.g., patterned to delineate the position of both the one or more fins 102 and anchors 104).

Figure 9:
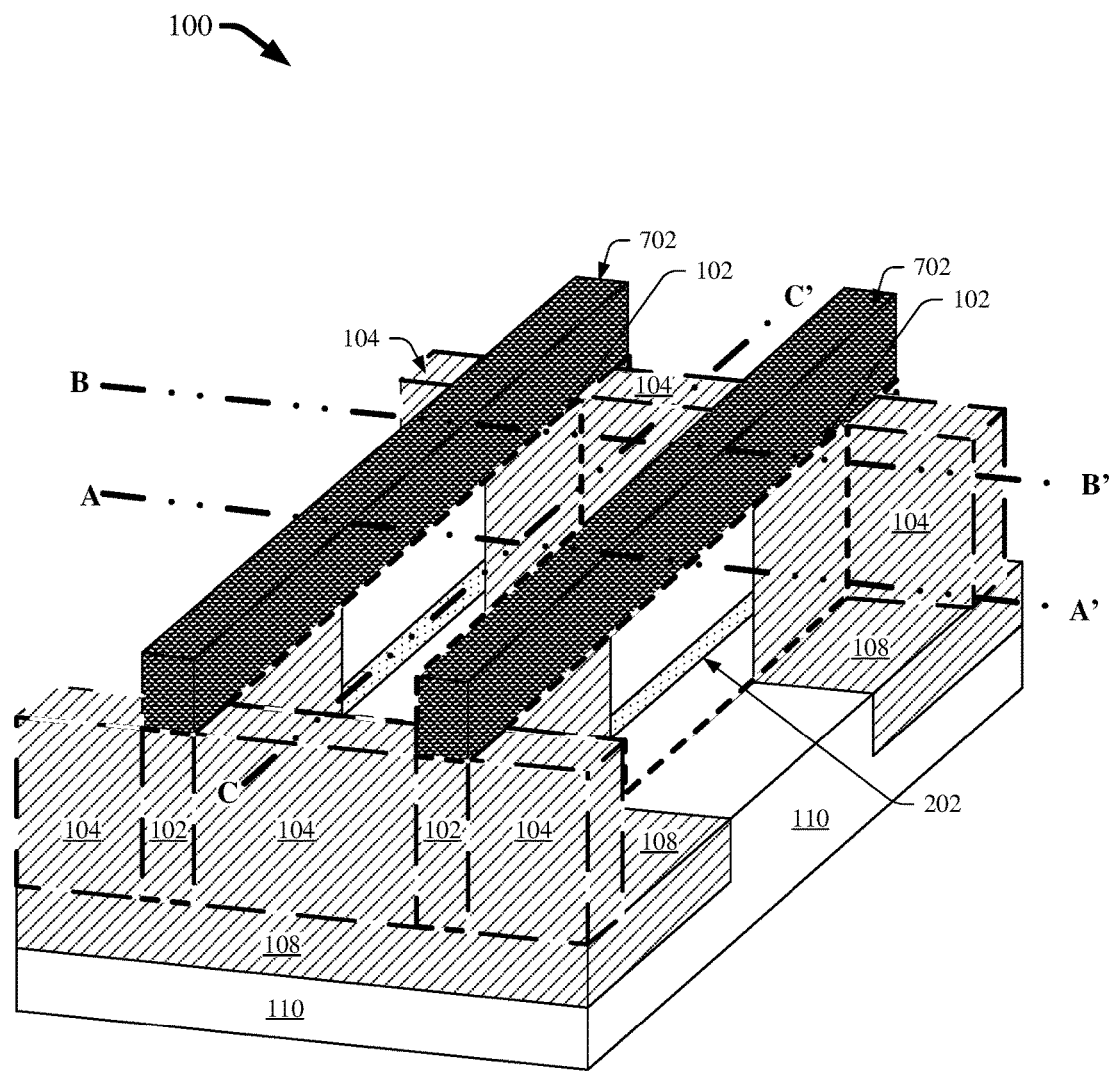
FIG. 9 illustrates a diagram of an example, non-limiting semiconductor device during a fifth stage of manufacturing, wherein the semiconductor device can comprise one or more anchors that can provide postural support to one or more stacked VTFET devices in accordance with one or more embodiments described herein.

FIG. 9 illustrates a diagram of the example, non-limiting semiconductor device 100 during a fifth stage of manufacturing in accordance with one or more embodiments described herein. Repetitive description of like elements employed in other embodiments described herein is omitted for sake of brevity. As shown in FIG. 9, the fifth stage of manufacturing can comprise etching exposed portions of the semiconductor body to form the one or more fins 102 and/or anchors 104.

For example, exposed portions of the semiconductor body (e.g., portions not protected by a mask, such as the one or more fin mask layers 702 and/or anchor mask layers 802) can be removed via one or more etching processes. Etching the exposed portions can: form the one or more fins 102, form the one or more anchors 104, and/or define regions adjacent to the one or more fins 102 and/or anchors 104 that can subsequently comprise the various features of the one or more stacked VTFET devices. In one or more embodiments, the one or more fins 102 and/or anchors 104 can be formed from the same etching process (e.g., RIE). For example, a single etching process (e.g., a single pass of the etching process) can form both one or more fins 102 and anchors 104. Advantageously, forming the one or more anchors 104 with the same etching process that forms the one or more fins 102 can enable the one or more anchors 104 to provide postural support to the one or more fins 102 starting from the fins' 102 initial formation.

As shown in FIG. 9, the fifth stage of manufacturing can also comprise removing the one or more anchor mask layers 802. In one or more embodiments, the one or more fin mask layers 702 can remain positioned on the one or more fins 102 subsequent to the firth stage to facilitate further manufacturing processes of the one or more stacked VTFET devices. Also shown in FIG. 9, the semiconductor device 100 can comprise an anchor 104 arrangement in which anchors 104 are positioned adjacent to opposing sides of the one or more fins 102 along the "X" axis. For example, one or more anchors 104 can be positioned adjacent to the left sidewall of a fin 102 and/or one or more additional anchors 104 can be positioned adjacent to the right sidewall of the subject fin 102.

Figure 10:
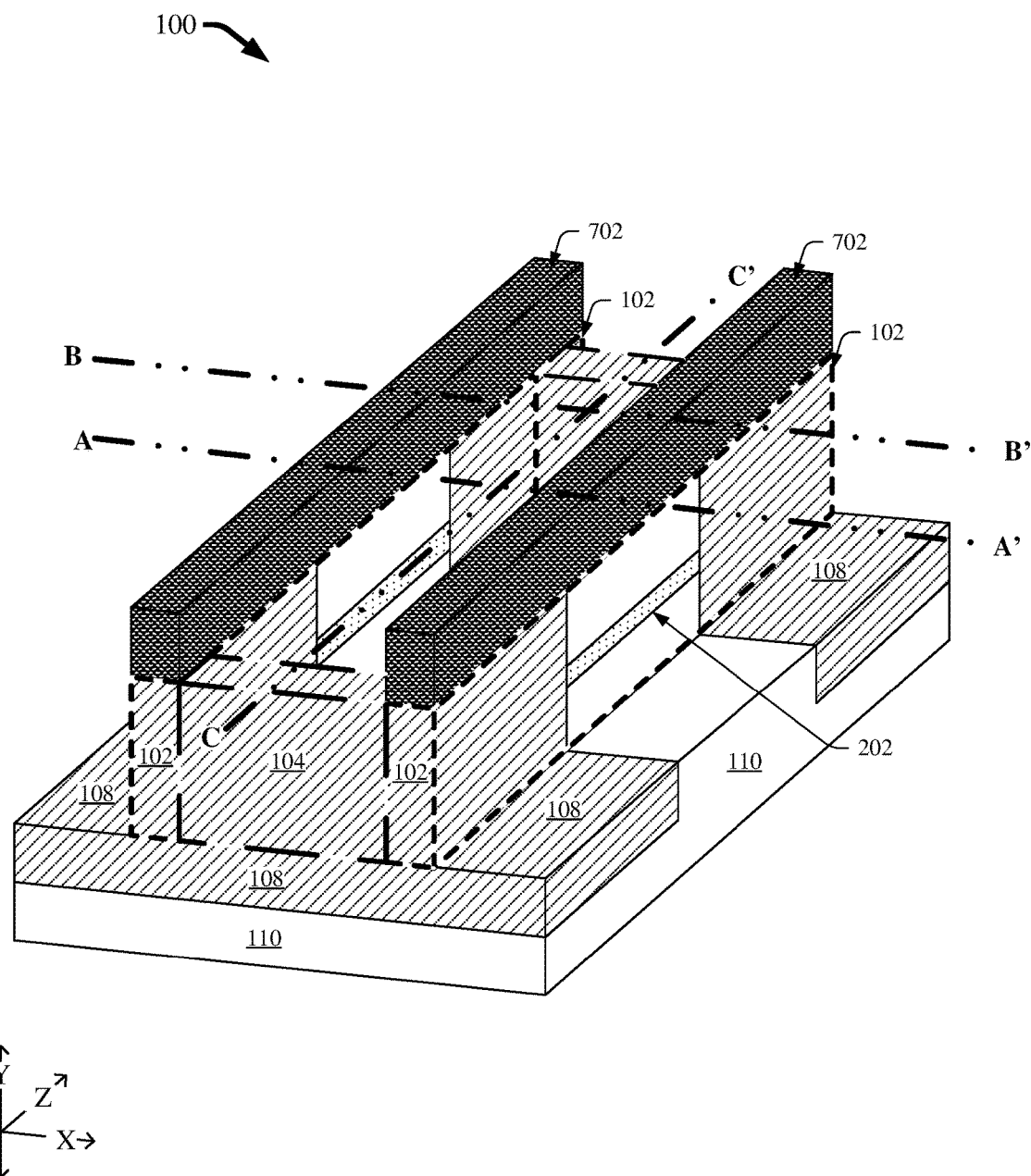
FIG. 10 illustrates a diagram of an example, non-limiting semiconductor device during the fifth stage of manufacturing, wherein the semiconductor device can comprise one or more anchors that can provide postural support to one or more stacked VTFET devices in accordance with one or more embodiments described herein.

FIG. 10 illustrates a diagram of an example, non-limiting alternate anchor 104 configuration that can be achieved during the first stage of manufacturing the semiconductor device 100 in accordance with one or more embodiments described herein. Repetitive description of like elements employed in other embodiments described herein is omitted for sake of brevity. As shown in FIG. 10, the various features described herein with regards to the third, fourth, and/or fifth stages of manufacturing can be utilized to achieve a wide variety of anchor 104 arrangements.

For example, in various embodiments the one or more anchor mask layers 802 can be limited to positions between adjacent fins 102. Thereby, the one or more etching processes of the fifth stage of manufacturing can form one or more anchors 104 just between adjacent fins 102 (e.g., as shown in FIG. 10). One of ordinary skill in the art will readily recognize that a plethora of arrangements regarding the one or more anchors 104 can be achieved by the manufacturing processes described herein, and the anchor 104 arrangements depicted in FIGS. 9 and/or 10 are merely two examples.

Subsequent to the formation of the one or more fins 102 and/or anchors 104, one or more additional manufacturing steps (not shown) can comprise forming the various features of the one or more stacked VTFET devices. For example, one or more removal processes can form one or more trenches into the portions of the semiconductor substrate 110 adjacent to the device regions of the one or more fins 102. Further, one or more first bottom source/drain regions 204 can be grown via one or more epitaxial processes within the formed trenches (e.g., to achieve the structure depicted in FIG. 2), and/or the one or more STIs 124 can be deposited, via one or more deposition processes, into the one or more trenches (e.g., to achieve the structure depicted in FIG. 2).

Once the one or more first bottom source/drain regions 204 and/or the one or more STIs 124 have been formed, one or more first bottom spacers 112 can be deposited (e.g., via one or more deposition processes) onto the one or more bottom source/drain regions 204, STIs 124, and/or dielectric layers 108 (e.g., to achieve the structure depicted in FIG. 1). For example, the one or more first bottom spacers 112 can be deposited around and/or adjacent to the one or more fins 102 and/or anchors 104.

Further, one or more first gate dielectric layers 116 can be deposited onto the one or more first bottom spacers 112 and onto a portion of the sidewalls of the one or more fins 102. Additionally, one or more first WFMs and/or first gate metal layers 118 can be deposited (e.g., via one or more deposition processes) onto the one or more first gate dielectric layers 116. Subsequently, the one or more first gate dielectric layers 116, first gate metal layers 118, and/or first WFMs can be etched (e.g., via one or more etching processes) to define one or more first gates adjacent to the one or more fins 102. Additionally, one or more first ILDs 120 can be deposited (e.g., via one or more deposition processes) onto the one or more first bottom spacers 112 and/or adjacent to the one or more first gates (e.g., to achieve the structure depicted in FIG. 1).

Once the one or more first gates and/or first ILDs 122 have been formed, one or more first top spacers 114 can be deposited (e.g., via one or more deposition processes) onto the one or more first gates and/or first ILDs 122 (e.g., to achieve the structure depicted in FIG. 1). Subsequently, one or more first top source/drain regions 106 can be grown via one or more epitaxial growth processes. The one or more first top source/drain regions 106 can be grown on the one or more first top spacers 114 and/or adjacent to the one or more fins 102 (e.g., to achieve the structure depicted in FIG. 1).

Once the one or more first top source/drain regions 106 and/or first top spacers 114 have been formed, the one or more isolation layers 122 can be deposited (e.g., via one or more deposition processes) onto the one or more first top source/drain regions 106 and/or first top spacers 114 (e.g., to achieve the structure depicted in FIG. 1). One or more first VTFETs (e.g., one or more bottom VTFETs) of the one or more stacked VTFET devices can comprise the one or more first bottom source/drain regions 204, first bottom spacers 112, first gates, first top spacers 114, and/or first top source/drain regions 106. Once the one or more first VTFETs have been formed, one or more additional VTFETs (e.g., top VTFETs) can be formed on top of the one or more first VTFETs (e.g., along the "Y" axis).

For example, once the one or more isolation layers 122 have been formed, one or more second bottom source/drain regions 204 can be grown via one or more epitaxial growth processes. The one or more second bottom source/drain regions 204 can be grown on the one or more isolation layers 122 and/or adjacent to the one or more fins 102 (e.g., to achieve the structure depicted in FIG. 1). Further, one or more first bottom spacers 112 can be deposited (e.g., via one or more deposition processes) onto the one or more first bottom source/drain regions 204 and/or isolation layers 122. For instance, the one or more second bottom spacers 112 can be deposited adjacent to the one or more fins 102.

Further, one or more second gate dielectric layers 116 can be deposited onto the one or more second bottom spacers 112 and onto a portion of the sidewalls of the one or more fins 102. Additionally, one or more second WFMs and/or second gate metal layers 118 can be deposited (e.g., via one or more deposition processes) onto the one or more second gate dielectric layers 116. Subsequently, the one or more second gate dielectric layers 116, second gate metal layers 118, and/or second WFMs can be etched (e.g., via one or more etching processes) to define one or more second gates adjacent to the one or more fins 102. Additionally, one or more second ILDs 120 can be deposited (e.g., via one or more deposition processes) onto the one or more second bottom spacers 112 and/or adjacent to the one or more second gates (e.g., to achieve the structure depicted in FIG. 1).

Once the one or more second gates and/or second ILDs 122 have been formed, one or more second top spacers 114 can be deposited (e.g., via one or more deposition processes) onto the one or more second gates and/or second ILDs 122 (e.g., to achieve the structure depicted in FIG. 1). Subsequently, one or more second top source/drain regions 106 can be grown via one or more epitaxial growth processes. The one or more second top source/drain regions 106 can be grown on top of the one or more fins 102 (e.g., to achieve the structure depicted in FIG. 1). Thereby, one or more second VTFETs (e.g., one or more top VTFETs) of the one or more stacked VTFET devices can comprise the one or more second bottom source/drain regions 204, second bottom spacers 112, second gates, second top spacers 114, and/or second top source/drain regions 106. In various embodiments, the additional manufacturing steps described herein can facilitate development of the one or more stacked VTFET devices depicted in FIGS. 1 and/or 2.

FIG. 11 illustrates flow diagram of an example, non-limiting method 1100 that can facilitate manufacturing one or more semiconductor devices 100 in accordance with one or more embodiments described herein. Repetitive description of like elements employed in other embodiments described herein is omitted for sake of brevity.

At 1102, the method 1100 can comprise etching a semiconductor body to form one or more fins 102 and/or one or more dielectric anchors 104, wherein the one or more dielectric anchors 104 can be adjacent and/or coupled to the one or more fins 102, and wherein the one or more dielectric anchors 104 can provide postural support to the one or more fins 102. For example, the etching at 1102 can be performed in accordance with the fifth stage of manufacturing described herein with regards to FIGS. 9 and/or 10. For instance, etching at 1102 can comprise one or more etching processes that can removed exposed portions of the semiconductor body not protected by one or more mask layers (e.g., fin mask layers 702 and/or anchor mask layers 802) to form the one or more fins 102 and/or anchors 104. In various embodiments, the etching at 1102 can comprise a single etching processes such that both the one or more fins 102 and anchors 104 can be formed by the same etching.

As described herein, the one or more fins 102 and/or anchors 104 formed by the etching at 1102 can extend from the semiconductor body. Further, the one or more fins 102 can comprise one or more isolation regions and/or device regions. One or more stacked VTFET devices can be formed within the one or more device regions, while the one or more isolation regions can serve to at least partially isolate the one or more device regions (e.g., and thereby the one or more stacked VTFET devices). Additionally, the one or more anchors 104 formed by the etching at 1102 can be located adjacent to the one or more isolation regions of the one or more fins 102.

At 1104, the method 1100 can comprise forming one or more stacked VTFET devices on the semiconductor body, wherein the one or more fins 102 can be comprised within the one or more stacked VTFET devices. For example, the one or more fins 102 can comprise one or more insulator layers 202 that can separate VTFETs within a subject stacked VTFET device; thereby enabling a fin 102 to be comprised within multiple VTFETs in a stacked VTFET device. In various embodiments, the forming at 1104 can be performed in accordance with the various additional manufacturing steps described herein to achieve a semiconductor device 100 structure depicted in FIGS. 1-4.

Figure 12:
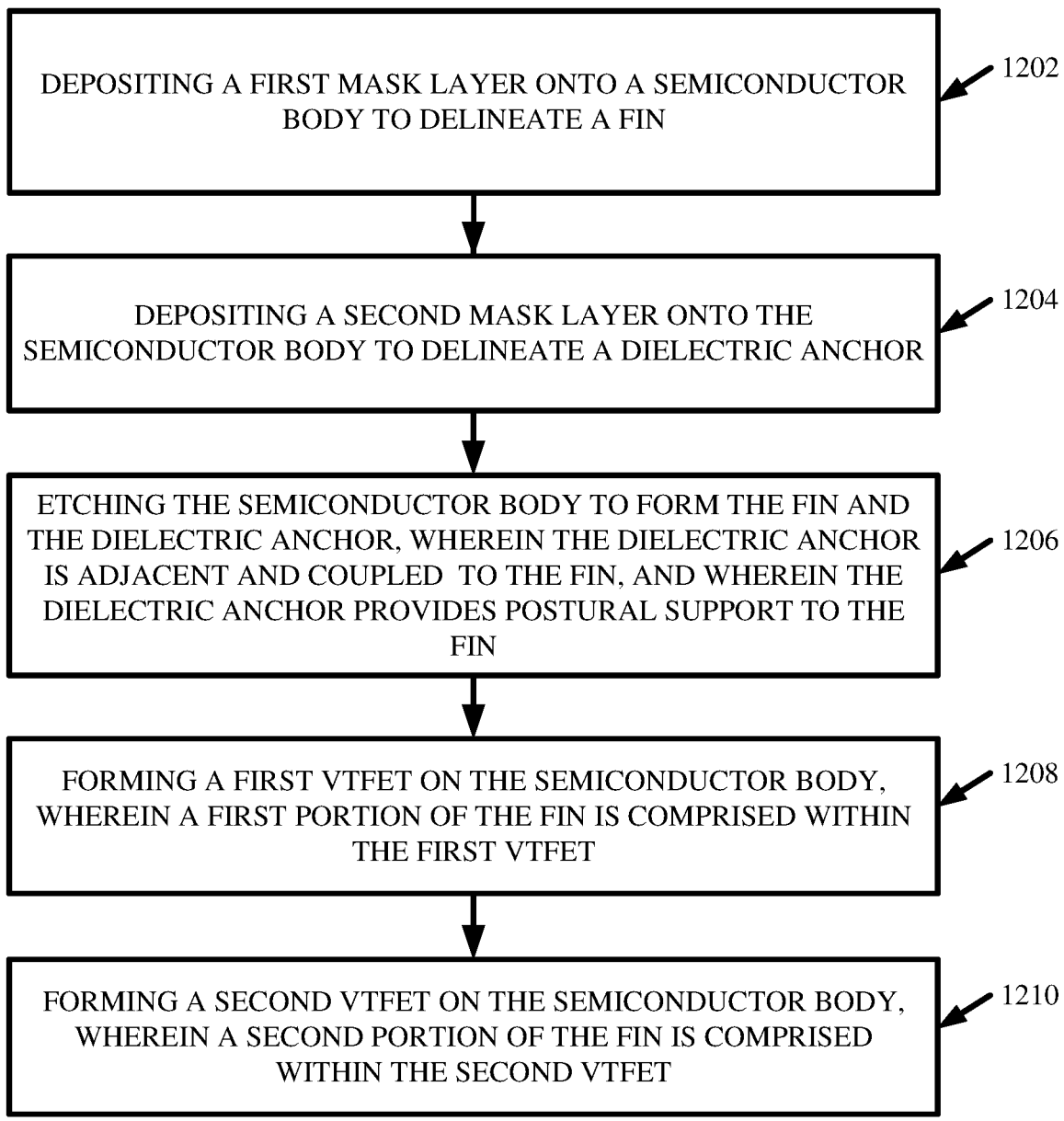
FIG. 12 illustrates a flow diagram of an example, non-limiting method that can facilitate manufacturing of a semiconductor device comprising one or more anchors that can provide postural support to one or more stacked VTFET devices in accordance with one or more embodiments described herein.

FIG. 12 illustrates flow diagram of an example, non-limiting method 1200 that can facilitate manufacturing one or more semiconductor devices 100 in accordance with one or more embodiments described herein. Repetitive description of like elements employed in other embodiments described herein is omitted for sake of brevity.

At 1202, the method 1200 can comprise depositing one or more first mask layers (e.g., fin mask layers 702) onto a semiconductor body to delineate one or more fins 102. For example, the depositing at 1202 can be performed in accordance with the third stage of manufacturing described herein with regards to FIG. 7. For instance, the depositing at 1202 can comprise depositing one or more fin mask layers 702 onto the semiconductor body via one or more deposition processes.

At 1204, the method 1200 can comprise depositing one or more second mask layers (e.g., anchor mask layers 802) onto the semiconductor body to delineate one or more dielectric anchors 104. For example, the depositing at 1204 can be performed in accordance with the fourth stage of manufacturing described herein with regards to FIG. 8. For instance, the depositing at 1204 can comprise depositing one or more anchor mask layers 802 onto the semiconductor body and/or the one or more first mask layers (e.g., fin mask layers 702) via one or more deposition processes.

At 1206, the method 1200 can comprise etching the semiconductor body to form the one or more fins 102 and/or dielectric anchors 104, wherein the one or more dielectric anchors 104 can be adjacent and coupled to the one or more fins 102, and wherein the one or more dielectric anchors 104 can provide postural support to the one or more fins 102. For example, the etching at 1206 can be performed in accordance with the fifth stage of manufacturing described herein with regards to FIGS. 9 and/or 10. For instance, etching at 1206 can comprise one or more etching processes that can removed exposed portions of the semiconductor body not protected by one or more first mask layers and/or second mask layers (e.g., fin mask layers 702 and/or anchor mask layers 802) to form the one or more fins 102 and/or anchors 104. In various embodiments, the etching at 1206 can comprise a single etching processes such that both the one or more fins 102 and anchors 104 can be formed by the same etching.

As described herein, the one or more fins 102 and/or anchors 104 formed by the etching at 1206 can extend from the semiconductor body. Further, the one or more fins 102 can comprise one or more isolation regions and/or device regions. One or more stacked VTFET devices can be formed within the one or more device regions, while the one or more isolation regions can serve to at least partially isolate the one or more device regions (e.g., and thereby the one or more stacked VTFET devices). Additionally, the one or more anchors 104 formed by the etching at 1206 can be located adjacent to the one or more isolation regions of the one or more fins 102.

At 1208, the method 1200 can comprise forming one or more first VTFETs on the semiconductor body, wherein the one or more first portions of the one or more fins 102 can be comprised within the one or more first VTFETs. For example, the forming at 1208 can be performed in accordance with the additional manufacturing steps described herein to achieve the semiconductor device 100 structure depicted in FIGS. 1-2. For instance, the forming at 1208 can comprise the various deposition processes and/or etching processes described herein to form the first VTFET (e.g., the bottom VTFET of a stacked VTFET device). The first VTFET can comprise the one or more first bottom source/drain regions 204, first bottom spacers 112, first gates, first IDLs 120, first top spacers 114, and/or first top source/drain regions 106 described herein.

At 1210, the method 1200 can comprise forming one or more second VTFETs on the semiconductor body, wherein the one or more second portions of the one or more fins 102 can be comprised within the one or more second VTFETs. For example, the forming at 1210 can be performed in accordance with the additional manufacturing steps described herein to achieve the semiconductor device 100 structure depicted in FIGS. 1-2. For instance, the forming at 1210 can comprise the various deposition processes and/or etching processes described herein to form the second VTFET (e.g., the top VTFET of a stacked VTFET device). The second VTFET can comprise the one or more second bottom source/drain regions 204, second bottom spacers 112, second gates, second IDLs 120, second top spacers 114, and/or second top source/drain regions 106 described herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a fin extending from a semiconductor body, wherein the fin is comprised within a stacked vertical transport field effect transistor device; and
a dielectric anchor extending from the semiconductor body and adjacent to the fin, wherein the dielectric anchor is coupled to the fin.

2. The apparatus of claim 1, wherein the stacked vertical transport field effect transistor device comprises a first vertical transport field effect transistor and a second vertical transport field effect transistor.

3. The apparatus of claim 2, wherein the fin is comprised within the first vertical transport field effect transistor and the second vertical transport field effect transistor.

4. The apparatus of claim 2, wherein the fin comprises an insulator layer positioned between the first vertical transport field effect transistor and the second vertical transport field effect transistor.

5. The apparatus of claim 4, wherein the first vertical transport field effect transistor is positioned between the second vertical transport field effect transistor and the semiconductor body.

6. The apparatus of claim 4, wherein the insulator layer electrically insulates the first vertical transport field effect transistor from the second vertical transport field effect transistor.

7. The apparatus of claim 1, wherein the dielectric anchor is coupled to an isolation region of the fin.

8. The apparatus of claim 7, wherein the dielectric anchor and the isolation region of the fin both comprise a dielectric material.

9. The apparatus of claim 4, wherein the isolation region at least partially isolates the stacked vertical transport field effect transistor device.

10. The apparatus of claim 4, wherein the isolation region and the dielectric anchor both comprise at least one dielectric material selected from a group consisting of silaketenylidene and silicon oxycarbonitride.

11. The apparatus of claim 1, wherein the dielectric anchor provides postural support to the fin during a manufacturing of the stacked vertical transport field effect transistor device.

12. The apparatus of claim 1, wherein the dielectric anchor is comprised within a plurality of dielectric anchors that extend from the semiconductor body and are adjacent to the fin, and wherein the plurality of dielectric anchors are coupled to the fin.

13. The apparatus of claim 1, further comprising:
a second fin extending from the semiconductor body, wherein the second fin is comprised within a second stacked vertical transport field effect transistor device, wherein the dielectric anchor is positioned between the fin and the second fin, and wherein the dielectric anchor is further coupled to the second fin.

14. An apparatus, comprising:
a first vertical transport field effect transistor stacked on a second vertical transport field effect transistor;
a fin extending from a semiconductor body, wherein the fin is comprised within both the first vertical transport field effect transistor and the second vertical transport field effect transistor; and
a dielectric anchor extending from the semiconductor body and adjacent to the fin, wherein the dielectric anchor provides postural support to the fin.

15. The apparatus of claim 14, wherein the fin comprises an isolation region and a device region.

16. The apparatus of claim 15, wherein the first vertical transport field effect transistor and the second vertical transport field effect transistor are positioned within the device region.

17. The apparatus of claim 16, wherein the dielectric anchor is positioned within the isolation region.

18. The apparatus of claim 15, wherein the isolation region and the dielectric anchor both comprise at least one dielectric material selected from a group consisting of silaketenylidene and silicon oxycarbonitride.

19. The apparatus of claim 15, wherein the dielectric anchor is comprised within a plurality of dielectric anchors that extend from the semiconductor body, and wherein the plurality of dielectric anchors are adjacent to the fin and provide postural support to the fin.

20. The apparatus of claim 15, further comprising:
a second fin extending from the semiconductor body, wherein the dielectric anchor is positioned between the fin and the second fin, and wherein the dielectric anchor further provides postural support to the second fin.

* * * * *